US007505258B2

(12) United States Patent
Kim et al.

(10) Patent No.: US 7,505,258 B2

(45) Date of Patent: Mar. 17, 2009

(54) PLASMA DISPLAY DEVICE WITH ENHANCED ELECTROMAGNETIC SHIELDING

(75) Inventors: Sok-San Kim, Suwon-si (KR); Tae-Kyoung Kang, Suwon-si (KR)

(73) Assignee: Samsung SDI Co., Ltd., Gyeonggi-Do (KR)

( * ) Notice: Subject to any disclaimer, the term of this patent is extended or adjusted under 35 U.S.C. 154(b) by 376 days.

(21) Appl. No.: 11/323,224

(22) Filed: Dec. 30, 2005

(65) Prior Publication Data

US 2006/0170347 A1 Aug. 3, 2006

(30) Foreign Application Priority Data

Jan. 20, 2005 (KR) ...................... 10-2005-0005302

(51) Int. Cl.
*G06F 1/16* (2006.01)
*H05K 5/00* (2006.01)
*H05K 7/00* (2006.01)

(52) U.S. Cl. ....................................... 361/683; 313/582

(58) Field of Classification Search ................. 361/683, 361/681; 313/582
See application file for complete search history.

(56) References Cited

U.S. PATENT DOCUMENTS

| | | | | |
|---|---|---|---|---|
| 7,211,741 | B2 * | 5/2007 | Kim et al. | 174/381 |
| 7,218,044 | B2 * | 5/2007 | Kim et al. | 313/112 |
| 7,235,927 | B2 * | 6/2007 | Yoo | 313/586 |
| 7,323,808 | B2 * | 1/2008 | Kim et al. | 313/44 |
| 7,362,043 | B2 * | 4/2008 | Cha | 313/112 |
| 2002/0159240 | A1 | 10/2002 | Watanabe et al. | |
| 2004/0160183 | A1 * | 8/2004 | Kim | 313/582 |
| 2004/0263040 | A1 * | 12/2004 | Kim et al. | 313/112 |
| 2005/0077822 | A1 * | 4/2005 | Kim et al. | 313/582 |
| 2005/0099106 | A1 * | 5/2005 | Kim et al. | 313/46 |

FOREIGN PATENT DOCUMENTS

| | | | |
|---|---|---|---|
| JP | 04-094197 | A | 3/1992 |
| JP | 10-319858 | A | 12/1998 |
| JP | 11-038893 | A | 2/1999 |
| JP | 11-119673 | A | 4/1999 |
| JP | 11219122 | A | 8/1999 |
| JP | 11-185641 | A | 9/1999 |
| JP | 11-338372 | A | 12/1999 |
| JP | 2000-158578 | A | 6/2000 |
| JP | 2000-340991 | A | 12/2000 |

(Continued)

*Primary Examiner*—Hae Moon Hyeon
(74) *Attorney, Agent, or Firm*—Knobbe Martens Olson & Bear LLP

(57) ABSTRACT

A plasma display device including improved electromagnetic shielding and improved impact resistance is disclosed. An embodiment of the plasma display device includes a plasma display module, and front and rear covers disposed over the front and rear sides of the plasma display module, respectively. The plasma display module comprises a plasma display panel, a chassis base mounted to a rear of the plasma display panel and supporting the same, a main shielding portion disposed on a front of the plasma display panel, and a tempered glass panel dimensioned and configured to cover an opening provided on the front cover such that at least a portion of an image formed on the plasma display panel is viewable therethrough. The main shielding portion is a filter such as a film formed from an electromagnetic shielding material.

10 Claims, 3 Drawing Sheets

FOREIGN PATENT DOCUMENTS

| | | | |
|---|---|---|---|
| JP | 2002-006755 | A | 1/2002 |
| JP | 2002-372917 | A | 12/2002 |
| JP | 2003-066854 | A | 3/2003 |
| JP | 2004-039989 | A | 2/2004 |
| JP | 2004-158861 | A | 6/2004 |
| JP | 2004-206076 | A | 7/2004 |
| KR | 1020030024413 | A | 3/2003 |

* cited by examiner

PLASMA DISPLAY DEVICE WITH ENHANCED ELECTROMAGNETIC SHIELDING

CROSS-REFERENCE TO RELATED APPLICATION

This application claims priority to and the benefit of Korean Patent Application No. 10-2005-0005302 filed in the Korean Intellectual Property Office on Jan. 20, 2005, the entire content of which is incorporated herein by reference.

BACKGROUND OF THE INVENTION

1. Technical Field

The present disclosure relates to a plasma display device, and more particularly, to a plasma display device that effectively shields harmful electromagnetic radiation emitted from a front surface of a plasma display panel.

2. Discussion Of Related Technologies

Generally, a plasma display device generates a desired image using plasma discharges generated therein. Typically, the plasma display device includes a plasma display panel (PDP) for displaying a desired image thereon by using plasma discharges generated in discharge cells, a chassis base for firmly supporting the PDP on a front side thereof, and printed circuit board assemblies (PBAs), which drive the PDP, and which are mounted on a rear side of the chassis base. This assembly is also referred to herein as a "plasma display module." In a typical plasma display device, a front case and a rear case are disposed over the front side and the rear side of a plasma display module, thereby enclosing the same. An opening is typically provided in the front case, thereby permitting a user to view images generated by the plasma display panel.

A plasma display device with the above-described structure has several problems, however, for example, exposing a user to potentially harmful electromagnetic radiation. The opening in the front case directly exposes a user to any harmful electromagnetic radiation generated by the plasma display panel. Furthermore, the PDP is susceptible to external impacts through the opening in the front case. The PDP is also exposed to internal impact. Because the front case contacts the surface of the PDP, impacts to the plasma display device are transmitted to the PDP through the front case.

The information in this Background section is provided only as an aid in understanding the background of the invention and therefore, is not an admission that the information is prior art known in this country to a person of ordinary skill in the art.

SUMMARY OF CERTAIN INVENTIVE ASPECTS

Embodiments disclosed herein include a plasma display device comprising shielding for electromagnetic radiation radiated from a plasma display panel. Other embodiments provide a plasma display device in which the plasma display panel is protected from internal and/or external impact.

Some embodiments of a plasma display device include a plasma display module and front and rear covers disposed over the front and rear sides of the plasma display module, respectively. The plasma display module includes a plasma display panel, a chassis base secured to and supporting the rear of the plasma display panel, a main shielding portion disposed on the front of the plasma display panel, and a tempered glass panel dimensioned and configured to cover an opening provided on the front cover such that at least a portion of the plasma display panel is viewable therethrough. In some embodiments, the main shielding portion comprises a filter formed into a film shape comprising an electromagnetic shielding.

In some embodiments, the tempered glass panel has a predetermined color.

In some embodiments, the plasma display module further comprises a secondary shielding portion substantially surrounding the sides of the plasma display panel, wherein the secondary shielding portion is dimensioned and configured to shield a user from electromagnetic radiation radiated from the interface between the main shielding portion and the plasma display panel. In some embodiments, the secondary shielding portion includes a shielding member formed from an electromagnetic shielding material, wherein a first end of the shielding member is electromechanically connected to the main shielding portion, and a second end is electromechanically connected to the chassis base. The chassis base may also be formed from an electromagnetic shielding material.

Furthermore, in some embodiments, the electromagnetic shielding material is a conductive material or a metal.

In some embodiments, the plasma display module further includes a reinforcing member provided to the chassis base on a side opposite to the plasma display panel. The secondary shielding portion comprises a shielding member formed from an electromagnetic shielding material, wherein a first end of the shielding member is electromechanically connected to the main shielding portion, and wherein a second end of the shielding member is electromechanically connected to the reinforcing member. In some embodiments, the reinforcing member is formed from an electromagnetic shielding material. In some embodiments, the electromagnetic shielding material comprises a conductive material or a metal.

Some embodiments of the plasma display module further include a vibration absorber disposed between the main shielding portion and the secondary shielding portion, wherein the vibration absorber shields a user from electromagnetic radiation and absorbs any impact transmitted to the main shielding portion and the plasma display panel. In some embodiments, the vibration absorber includes a vibration absorbing member formed from an elastic material and a metallic cover at least partially surrounding the vibration absorbing member. In some embodiments, the vibration absorber further includes a flame resistant member disposed between the vibration absorbing member and the metallic cover. In some embodiments, the metallic cover is formed from a metal fiber, a metal film, or a combination thereof.

DETAILED DESCRIPTION OF CERTAIN INVENTIVE EMBODIMENTS

Figure 1:
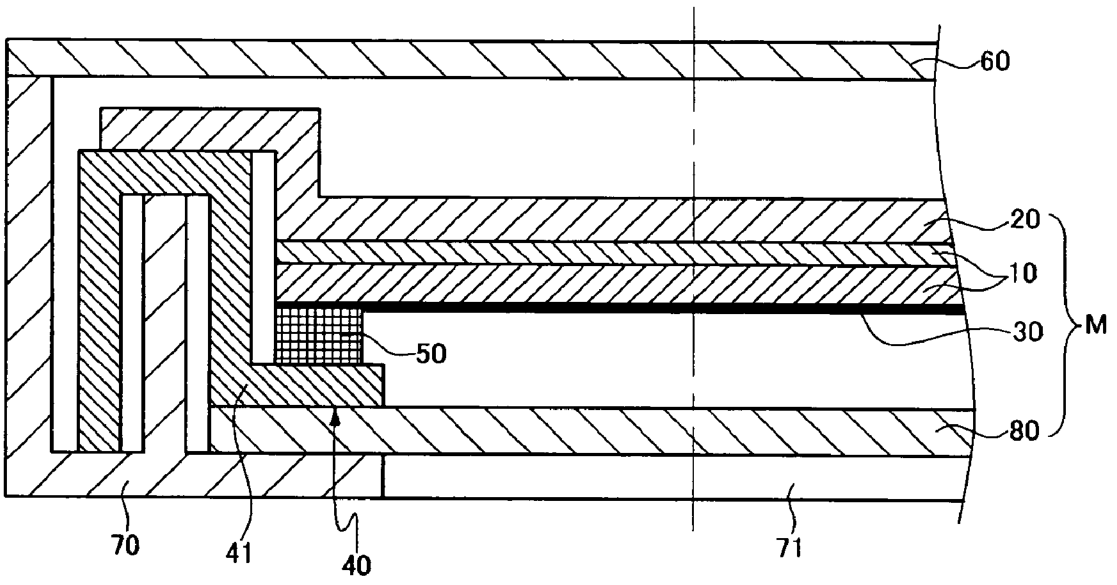
FIG. 1 is a schematic diagram illustrating a cross section of a plasma display device according to a first exemplary embodiment of the present invention.

Embodiments of the present invention will hereinafter be described in detail with reference to the accompanying drawings. As those skilled in the art would realize, the described embodiments may be modified in various different ways, all without departing from the spirit or scope of the present invention. Accordingly, the drawings and description are illustrative in nature and not restrictive. Like reference numerals designate like elements throughout the specification.

FIG. 1 is a schematic diagram illustrating in cross section a plasma display device according to a first exemplary embodiment of the present invention. As shown in FIG. 1, the plasma display device includes a plasma display module M, a front cover 70, and a rear cover 60. The plasma display module M includes a PDP 10, a chassis base 20, a main shielding portion 30, and a transparent panel 80, such as a tempered glass panel. The PDP 10 is driven by printed circuit board assemblies (PBAs, not shown) electromechanically connected to the PDP 10 thereby causing the display of a desired image.

The chassis base 20 is mounted on the rear surface of the PDP 10, thereby supporting the PDP 10 at its rear surface. In the illustrated embodiment, the chassis base 20 is formed by stamping a thin plate of a metallic material into the illustrated shape, which exhibits sufficient mechanical strength against twisting and bending forces. Consequently, in the illustrated embodiment, the chassis base 20 comprises a bend at its end portion to form an L-shaped cross-section. In other embodiments, the chassis base 20 is provided with a reinforcing member. In other embodiments, the chassis base 20 is formed by another method known in the art, for example, by casting, forging, welding, and the like.

The main shielding portion 30, attached to the front of the PDP 10, shields users from electromagnetic radiation emitted from the front of the PDP 10. In some embodiments, the main shielding portion 30 comprises an electromagnetic shielding material having a sufficient conductivity. In the illustrated embodiment, the main shielding portion 30 is a film disposed substantially over the entire front of the PDP 10. In other embodiments, the main shielding portion 30 does not substantially cover the entire front of the PDP 10.

The transparent panel 80 such as a tempered glass panel is provided on the inner side of the front cover 70 and covers the opening 71 in the front cover 70 through which images are viewed. In some embodiments, the perimeter of the transparent panel 80 is secured to the front cover 70 using, for example, double-sided adhesive tape (not shown). Accordingly, in the illustrated embodiment, the transparent panel 80 protects the PDP 10 from external impact. In some embodiments, the transparent panel 80 is colored with an arbitrary color such as a blue, gray, or black. A colored transparent panel 80 reduces reflections from the surface, thereby improving contrast and/or color coordinate characteristics of the display panel.

The front cover 70 and the rear cover 60 are connected so that they enclose the front side and the rear side of a plasma display module M.

The illustrated embodiment also comprises a secondary shielding portion 40. The secondary shielding portion 40 is in electrical connection with the main shielding portion 30. In the illustrated embodiment, the secondary shielding portion 40 surrounds the sides of the PDP 10. In some embodiments, the secondary shielding portion 40 comprises a shielding member 41 with an L-shaped cross-section that makes surface contact with at least a portion of the main shielding portion 30. In some embodiments, the shielding member 41 is secured to the transparent panel 80, for example, using double-sided adhesive tape. Accordingly, electromagnetic radiation radiated from the side of the PDP 10 is shielded from the user by the secondary shielding portion 40 surrounding the sides thereof.

In the illustrated embodiment, a first portion of the shielding member 41 electrically contacts the main shielding portion 30, and a second portion electrically contacts the chassis base 20. In this case, the chassis base 20 comprises an electromagnetic radiation-shielding material, for example, a conductive material such as metal.

Also illustrated is a vibration absorber 50 disposed between the main shielding portion 30 and the secondary shielding portion 40. A first side of the vibration absorber 50 contacts the main shielding portion 30, and a second side contacts the secondary shielding portion 40. In the illustrated configuration, the vibration absorber 50 cushions the main shielding portion 30 and the PDP 10 from impact.

Figure 2:
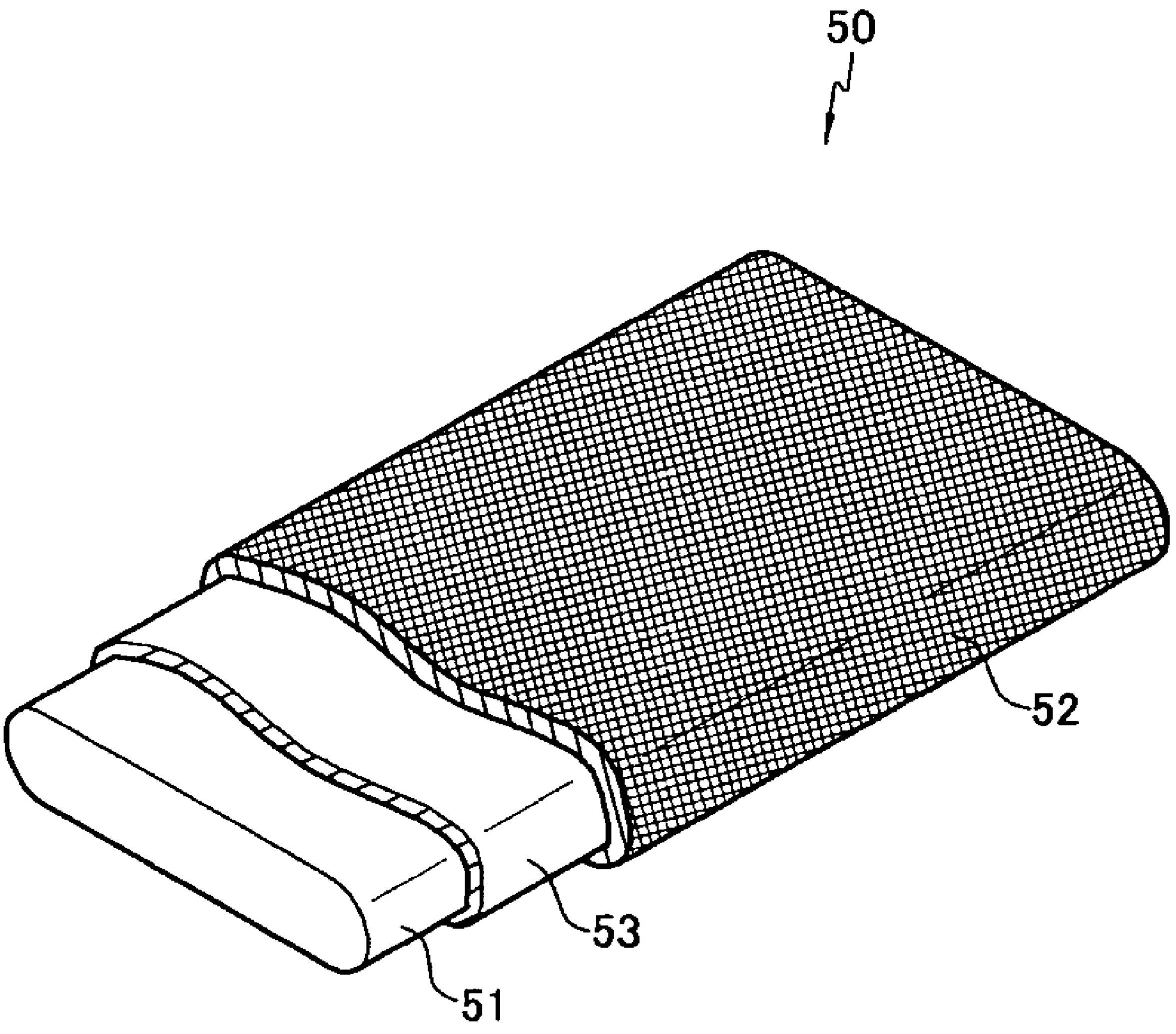
FIG. 2 is a perspective view of a vibration absorber used in a plasma display device according to a first exemplary embodiment of the present invention.

Hereinafter, an exemplary embodiment of the vibration absorber 50 will be described in detail. FIG. 2 illustrates a perspective view of a vibration absorber 50 according to a first exemplary embodiment of the present invention.

The illustrated vibration absorber 50 includes a vibration absorbing member 51 and a covering member 52. The vibration absorber 50 optionally includes a flame resistant member 53, which is placed between the vibration absorbing member 51 and the covering member 52 so as to protect the vibration absorbing member 51 from vibration and/or heat. In preferred embodiments, the vibration absorbing member 51 is formed from an elastic material, for example, sponge or foam, which effectively absorbs vibration. The vibration absorbing member 51 is dimensioned and configured to fit into a space between the main shielding portion 30 and the secondary shielding portion 40.

In the illustrated embodiment, the covering member 52 substantially encloses the vibration absorbing member 51. As discussed above, the vibration absorber 50 electrically connects the main shielding portion 30 and the secondary shielding portion 40 through the covering member 52. Consequently in the illustrated embodiment, the covering member 52 is formed from a conductive material such as a metal. In some of these embodiments, the vibration absorber 50 also provides a shielding function in addition to the vibration absorbing function. In some embodiments, the covering member 52 has a predetermined elasticity, thereby contributing to the damping function of the vibration absorber 50. For example, in some embodiments, the covering member 52 is formed from a metallic component, for example, a metal fiber wrapped around the vibration absorbing member 51, or a woven fabric of metal fibers. In alternative embodiments, the covering member 52 is formed as a film.

The optional flame resistant member 53 is formed from a flame-resistant material.

In another embodiment (not illustrated), the rear cover 60 comprises an electromagnetic shielding material and the secondary shielding portion 40 is electromechanically connected with the rear cover 60.

Figure 3:
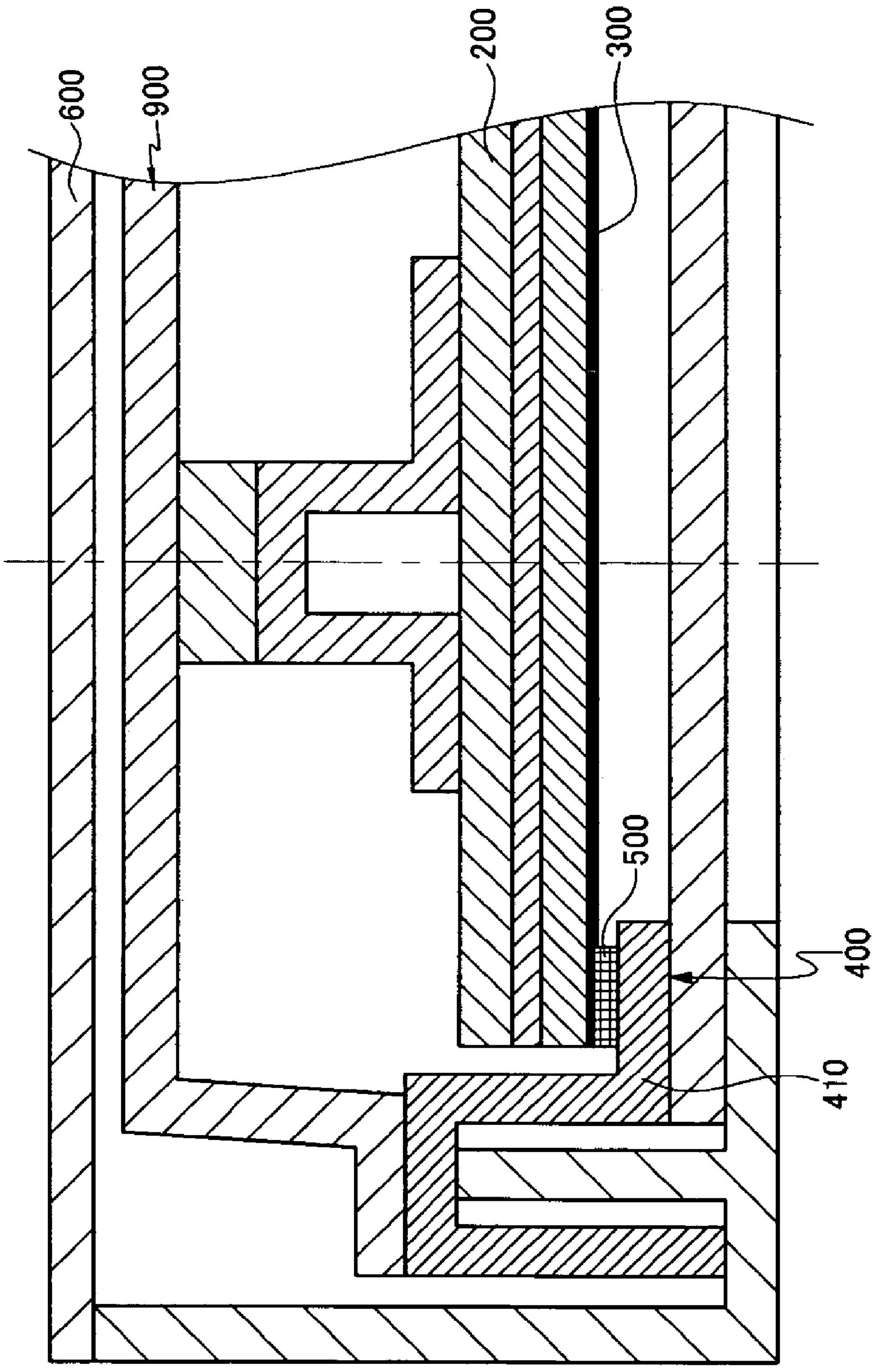
FIG. 3 is a schematic diagram illustrating a cross section of a plasma display device according to a second exemplary embodiment of the present invention.

Hereinafter, a plasma display device according to a second exemplary embodiment will be described in detail. FIG. 3 schematically illustrates a plasma display device according to a second exemplary embodiment. A plasma display device according to the second exemplary embodiment described hereinafter is similar to one according to the first exemplary embodiment in general scheme and operation. Therefore, in the description of the second exemplary embodiment below, only differences from the first exemplary embodiment are described in detail.

In this embodiment, the plasma display device further includes a reinforcing member that enhances the strength of the chassis base 200. In the illustrated embodiment, the reinforcing member is a reinforcing bracket 900 disposed on the rear of a chassis base 200. The reinforcing bracket 900 enhances the strength of the chassis base 200 and permits, for example, mounting of PBAs to the rear side thereof. In the illustrated embodiment, the reinforcing bracket 900 has the illustrated offset or Z-shaped cross section, which also provides a location suitable for mounting one or more PBAs. The reinforcing bracket 900 is fastened onto the chassis base 200 in a suitable way, for example, using screws, rivets, adhesives, pins, and the like. Skilled technologists will understand that other arrangements for the reinforcing bracket 900 are also possible.

According to an exemplary embodiment, the secondary shielding portion 400 includes a shielding member 410. A first end of the shielding member 410 is secured to the main shielding portion 300, and a second end is secured to the reinforcing bracket 900. Preferably, the shielding member 410 is formed of an electromagnetic shielding material, for example, a conductive material such as a metal.

In an alternative embodiment (not illustrated), the chassis base 200 comprises an electromagnetic shielding material, and electrically contacts the chassis base 200. In other embodiments, the rear cover 600 comprises an electromagnetic shielding material, and electrically contacts the shielding member 410. Also illustrated is a vibration absorber 500, which is similar to the vibration absorber 50, described above.

The present disclosure is not limited to the disclosed embodiments, but is intended to cover modifications and equivalent arrangements included within the spirit and scope of the appended claims.

What is claimed is:

1. A plasma display device comprising:

a plasma display module; and front and rear covers disposed over the front and rear sides of the plasma display module, respectively;

wherein the plasma display module comprises:

a plasma display panel;

a chassis base secured to and supporting a rear of the plasma display panel;

a main shielding portion disposed on a front of the plasma display panel; and a transparent panel dimensioned and configured to cover an opening provided on the front cover such that at least a portion of the plasma display panel is viewable therethrough, wherein the main shielding portion comprises a film formed from an electromagnetic shielding material; and wherein the plasma display module further comprises a secondary shielding portion substantially surrounding the sides of the plasma display panel, wherein the secondary shielding portion is dimensioned and configured to shield against electromagnetic radiation radiated from the interface of the main shielding portion and the plasma display panel.

2. The plasma display device of claim 1, wherein the tempered glass panel with a predetermined color.

3. The plasma display device of claim 2, wherein the secondary shielding portion comprises:

a shielding member formed from an electromagnetic shielding material, wherein a first end of the shielding member is electromechanically connected to the main shielding portion, and a second end is electromechanically connected to the chassis base; and the chassis base comprises an electromagnetic shielding material.

4. The plasma display device of claim 3, wherein the electromagnetic shielding material of the shielding member is a conductive material or a metal.

5. The plasma display device of claim 2, wherein:

the plasma display module further comprises a reinforcing member provided to the chassis base on a side opposite to the plasma display panel; and the secondary shielding portion comprises a shielding member comprising an electromagnetic shielding material wherein a first end of the shielding member is electromechanically connected to the main shielding portion, and wherein a second end of the shielding member is electromechanically connected to the reinforcing member.

6. The plasma display device of claim 5, wherein the electromagnetic shielding material is a conductive material or a metal.

7. The plasma display device of claim 2, wherein the plasma display module further comprises a vibration absorber disposed between the main shielding portion and the secondary shielding portion, wherein the vibration absorber shields against electromagnetic radiation and absorbs an impact transmitted to the main shielding portion and the plasma display panel.

8. The plasma display device of claim 7, wherein the vibration absorber comprises a vibration absorbing member formed from an elastic material and a metallic component at least partially surrounding the vibration absorbing member.

9. The plasma display device of claim 8, wherein the vibration absorber further comprises a flame resistant member disposed between the vibration absorbing member and the metallic component.

10. The plasma display device of claim 8, wherein the metallic component comprises a metal fiber, a metal film, or a combination thereof.

* * * * *